(12) United States Patent  
Zhu et al.

(10) Patent No.: US 10,204,861 B2  
(45) Date of Patent: Feb. 12, 2019

(54) STRUCTURE WITH LOCAL CONTACT FOR SHORTING A GATE ELECTRODE TO A SOURCE/DRAIN REGION

(71) Applicant: GLOBALFOUNDRIES INC., Grand Cayman (KY)

(72) Inventors: Xuelian Zhu, San Jose, CA (US); Jia Zeng, Sunnyvale, CA (US); Wenhui Wang, San Jose, CA (US); Youngtag Woo, San Ramon, CA (US); Jongwook Kye, Pleasanton, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/399,200

(22) Filed: Jan. 5, 2017

(65) Prior Publication Data

US 2018/0190588 A1  Jul. 5, 2018

(51) Int. Cl.  
*H01L 29/06* (2006.01)  
*H01L 29/66* (2006.01)  
(Continued)

(52) U.S. Cl.  
CPC ...... *H01L 23/535* (2013.01); *H01L 21/76895* (2013.01); *H01L 21/76897* (2013.01);  
(Continued)

(58) Field of Classification Search  
CPC ..... H01L 21/823475; H01L 21/823828; H01L 21/823864; H01L 21/823871; H01L 21/0217; H01L 21/02116; H01L 21/3212; H01L 21/32133; H01L 23/535; H01L 23/522–23/53295; H01L 23/528; H01L 23/53238; H01L 27/0886; H01L 29/0649; H01L 29/0653; H01L 29/66545; H01L 21/823431; H01L 21/823821; H01L 21/845; H01L 27/0924; H01L 27/10826; H01L 27/10879; H01L 27/1211; H01L 29/41791; H01L 29/66795–29/66818; H01L 29/785–29/7856; H01L 2029/7857–2029/7858; H01L 2924/13067; H01L 21/76897; H01L 21/66895; H01L 21/76877; H01L 21/76879; H01L 21/76802; H01L 21/76805; H01L 21/76807–21/76813;  
(Continued)

(56) References Cited

U.S. PATENT DOCUMENTS 8,921,947 B1 * 12/2014 Hung .................... H01L 29/458  
257/202  
9,105,614 B2 * 8/2015 Sardesai ......... H01L 21/823425  
(Continued)

*Primary Examiner* — Marc Anthony Armand  
*Assistant Examiner* — Younes Boulghassoul  
(74) *Attorney, Agent, or Firm* — Francois Pagette; Andrew M. Calderon; Roberts Mlotkowski Safran Cole & Calderon P.C.

(57) ABSTRACT

The present disclosure relates to semiconductor structures and, more particularly, to contacts for local connections and methods of manufacture. The structure includes: at least one contact electrically shorted to a gate structure and a source/drain contact and located below a first wiring layer; and gate, source and drain contacts extending from selected gate structures and electrically connecting to the first wiring layer.

16 Claims, 4 Drawing Sheets

(51) Int. Cl.
*H01L 29/78* (2006.01)
*H01L 23/535* (2006.01)
*H01L 29/417* (2006.01)
*H01L 21/768* (2006.01)

(52) U.S. Cl.
CPC ...... *H01L 29/0642* (2013.01); *H01L 29/4175* (2013.01); *H01L 29/41791* (2013.01); *H01L 29/66795* (2013.01); *H01L 29/785* (2013.01)

(58) Field of Classification Search
CPC ......... H01L 21/76814; H01L 21/76816; H01L 21/76837; H01L 21/66515; H01L 23/481; H01L 29/458; H01L 29/41733; H01L 29/41775
USPC ......... 257/382, 369, 390, E27.081, E29.255, 257/E21.409; 438/294
See application file for complete search history.

(56) References Cited

U.S. PATENT DOCUMENTS

| | | | | |
|---|---|---|---|---|
| 9,412,700 | B2* | 8/2016 | Hsieh | H01L 23/535 |
| 9,660,042 | B1* | 5/2017 | Hung | H01L 29/45 |
| 2007/0080423 | A1* | 4/2007 | Tsuboi | H01L 27/11 257/506 |
| 2012/0135577 | A1* | 5/2012 | Lee | H01L 21/76829 438/299 |
| 2012/0187504 | A1* | 7/2012 | Igarashi | H01L 21/76895 257/390 |
| 2013/0161722 | A1* | 6/2013 | Son | H01L 29/78 257/321 |
| 2013/0193489 | A1* | 8/2013 | Baars | H01L 27/11 257/213 |
| 2014/0327080 | A1* | 11/2014 | Hung | H01L 29/66515 257/365 |
| 2014/0349476 | A1* | 11/2014 | Chen | H01L 21/76816 438/620 |
| 2015/0333073 | A1* | 11/2015 | Chang | H01L 27/1104 257/401 |
| 2015/0340326 | A1* | 11/2015 | Lytle | H01L 21/823842 257/372 |
| 2016/0071791 | A1* | 3/2016 | Huang | H01L 23/522 257/401 |
| 2016/0071848 | A1* | 3/2016 | Sengupta | H01L 27/0886 257/401 |
| 2016/0104645 | A1* | 4/2016 | Hung | H01L 21/823437 257/401 |
| 2016/0133623 | A1* | 5/2016 | Xie | H01L 27/088 257/384 |
| 2016/0211251 | A1* | 7/2016 | Liaw | H01L 27/0207 |
| 2016/0336183 | A1* | 11/2016 | Yuan | H01L 29/66795 |
| 2016/0365288 | A1* | 12/2016 | Wang | H01L 21/823828 |
| 2017/0040318 | A1* | 2/2017 | Hung | H01L 27/0886 |
| 2017/0053827 | A1* | 2/2017 | Wang | H01L 21/76897 |
| 2017/0141037 | A1* | 5/2017 | Wu | H01L 29/41791 |
| 2018/0190780 | A1* | 7/2018 | Lee | H01L 29/41791 |

* cited by examiner

STRUCTURE WITH LOCAL CONTACT FOR SHORTING A GATE ELECTRODE TO A SOURCE/DRAIN REGION

FIELD OF THE INVENTION

The present disclosure relates to semiconductor structures and, more particularly, to contacts for local connections which do not block the wiring level, and methods of manufacture.

BACKGROUND

Middle of the line (MOL) design is becoming more challenging in advanced technology nodes due to the cell size scaling and process capabilities. For the MOL local interconnect metals, due to track height scaling, there is less local routing resources for the drain and source contacts, as well as the gate contacts. This results in congestion at the MOL contact level and/or the lower wiring levels, e.g., M0 level.

For example, MOL architecture need two levels of contacts to connect gate to the first wiring level, e.g., M0 level. That results in more contact congestion. Also, congestion of the contacts occur when there is a need to use the M0 level to connect the source, drain and gate contacts for SRAM cross couple. In this situation, there may be a need to move VDD from the M0 layer to a higher wiring layer, e.g., M2 layer, and/or enable tighter M0 minimum area requirement or super via processes (e.g., a tall V0 directly connecting to the source/drain contacts).

Moreover, self-aligned gate contacts may be required to achieve the target area scaling in future technologies (i.e., 5 nm, 3 nm, etc. technology nodes). However, since self-aligned gate contacts do not short to gate structures, there is also a need to use the M0 layer to connect the source, drain and gate contacts for SRAM cross couple. This, in turn, causes further M0 congestion, and hence M0 level VDD in SRAM technologies may not be possible.

SUMMARY

In an aspect of the disclosure, a structure comprises: at least one contact electrically shorted to a gate structure and located below a first wiring layer; and source and drain contacts extending from selected gate structures and electrically connecting to the first wiring layer.

In an aspect of the disclosure, a structure comprises: at least one contact electrically shorted to a respective gate structure and electrically isolated from a first wiring layer; and source and drain contacts extending electrically connecting to the first wiring layer.

In an aspect of the disclosure, a method comprises: forming a plurality of contacts electrically shorted to respective gate structures located below a first wiring layer; and forming source and drain contacts extending from selected gate structures and electrically connecting to the first wiring layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
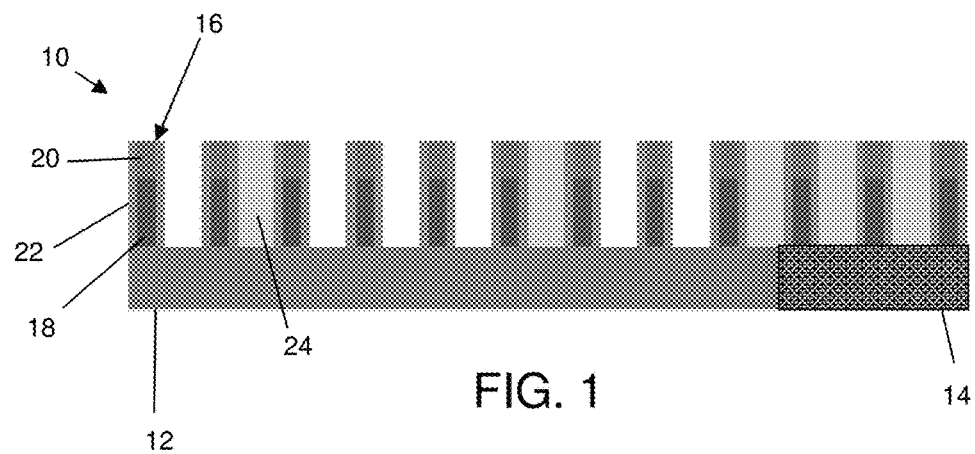
FIG. 1 shows a plurality of gate structures, amongst other features, and respective fabrication processes in accordance with aspects of the present disclosure.

The present disclosure relates to semiconductor structures and, more particularly, to contacts for local connections and methods of manufacture. More specifically, the present disclosure relates to a middle of the line (MOL) architecture with contacts for local connections, which do not block the lower wiring level, e.g. M0 level. Advantageously, the contacts for local connections provide more local routing resources, and do not block the wiring level, e.g. M0 level. Therefore, they are compatible with both SRAM and logic standard cell designs.

In embodiments, the present disclosure includes a MOL stack with a contact that does not block the lower wiring level (e.g., M0 level). The contact can be used for a local connection, with the source/drain contact and the gate contact being directly connected to the lower wiring level, e.g., M0 wiring level, when required. In embodiments, the local contact can be used as an SRAM cross couple or source/drain jumper, at a level lower than conventional contacts. Moreover, the MOL architecture is compatible with both single damascene and dual damascene processes, and is workable for designs with either non-self-aligned or self-aligned gate contacts and source/drain contacts.

The contacts for local connections of the present disclosure can be manufactured in a number of ways using a number of different tools. In general, though, the methodologies and tools are used to form structures with dimensions in the micrometer and nanometer scale. The methodologies, i.e., technologies, employed to manufacture the contacts for local connections of the present disclosure have been adopted from integrated circuit (IC) technology. For example, the structures are built on wafers and are realized in films of material patterned by photolithographic processes on the top of a wafer. In particular, the fabrication of the contacts for local connections uses three basic building blocks: (i) deposition of thin films of material on a substrate, (ii) applying a patterned mask on top of the films by photolithographic imaging, and (iii) etching the films selectively to the mask.

FIGS. 1-8 show structures and respective fabrication processes in accordance with aspects of the present disclosure. The fabrication processes described with respect to FIGS. 1-8 include self-aligned source/drain contacts and non self-aligned gate contact with a single damascene process for the source/drain and the gate contacts. By implementing the processes of FIGS. 1-8, for example, it is possible to solve both contact and wiring level congestion in MOL architectures, while allowing for both SRAM and logic standard cell design. Moreover, it is now possible to reduce the contact mask count in comparison to a conventional MOL architecture, which needs two levels of contacts to connect the gate to the first wiring level, e.g., M0 level. In addition, it is possible to keep VDD at a lower wiring layer (e.g., M0 wiring level) for SRAM with or without self-aligned gate contacts, while eliminating the need for M0 square (i.e., tight M0 minimum area rule) or super vias directly connecting the M1 level to the source and drain contacts.

More specifically, the structure 10 shown in FIG. 1 includes a fin structure 12 composed of any suitable semiconductor material including, but not limited to, Si, SiGe, SiGeC, SiC, GaAs, InAs, InP, and other III/V or II/VI compound semiconductors. A shallow trench isolation (STI) structure 14 can be formed prior to or after the formation of the fin structure 12, using conventional lithography, etching and deposition methods. In embodiments, the STI structure 14 can be an oxide material. In embodiments, the STI structure 14 can be optional at the location shown in FIG. 1.

In embodiments, the fin structure 12 can be formed by a sidewall image transfer (SIT) technique. In an example of a SIT technique, a mandrel material, e.g., $SiO_2$, is deposited on the semiconductor material using conventional chemical vapor deposition (CVD) processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the narrow fin structures 12. Spacers are formed on the sidewalls of the mandrels which are preferably material that is different than the mandrels, and which are formed using conventional deposition processes known to those of skill in the art. The spacers can have a width which matches the dimensions of the narrow fin structures 12, for example. The mandrels are removed or stripped using a conventional etching process, selective to the mandrel material. An etching is then performed within the spacing of the spacers to form the sub-lithographic features. The sidewall spacers can then be stripped.

Still referring to FIG. 1, a plurality of gate structures 16 (e.g., finFET structures) are formed over the fin structure 12. The gate structures 16 can be orthogonal to the fin structure 12 and can extend over multiple fin structures 12. In embodiments, the gate structures 16 can be formed by a gate last process or a gate first process. In the gate last process, for example, an amorphous poly material can be deposited on the fin structure 12, followed by a conventional patterning process, e.g., lithography and etching (reactive ion etching (RIE)) process. Sidewall spacers 22 can then be deposited on the patterned structures, followed by an anisotropic etching process to remove the sidewall spacer material on horizontal surfaces of the structures. In later processing steps, the poly material can be removed from between the spacers, followed by a deposition of high-k dielectric material within the space between the sidewall spacers 22. A workfunction metal(s) and a regular metal(s) 18, e.g., titanium nitride and tungsten, and hardmask material 20, e.g., SiN, can also be deposited on the high-k dielectric material between the sidewall spacers 22.

In a gate first process, on the other hand, after the deposition and patterning of the hardmask 20, e.g., SiN, workfunction metal(s) and regular metal(s) 18, e.g., titanium nitride and tungsten, and gate dielectric material, e.g., a high-k dielectric material such as a hafnium based material, sidewall spacers 22 can be deposited on the sidewalls of the patterned gate structures. The sidewall material formed on horizontal surfaces of the structure can be removed by an anisotropic etching process. In embodiments, the sidewall spacers 22 can be, e.g., SiOC. Insulator material 24, e.g., $SiO_2$, can be formed between selected gate structures 16, in many different combinations as shown in alternative aspects.

Figure 2:
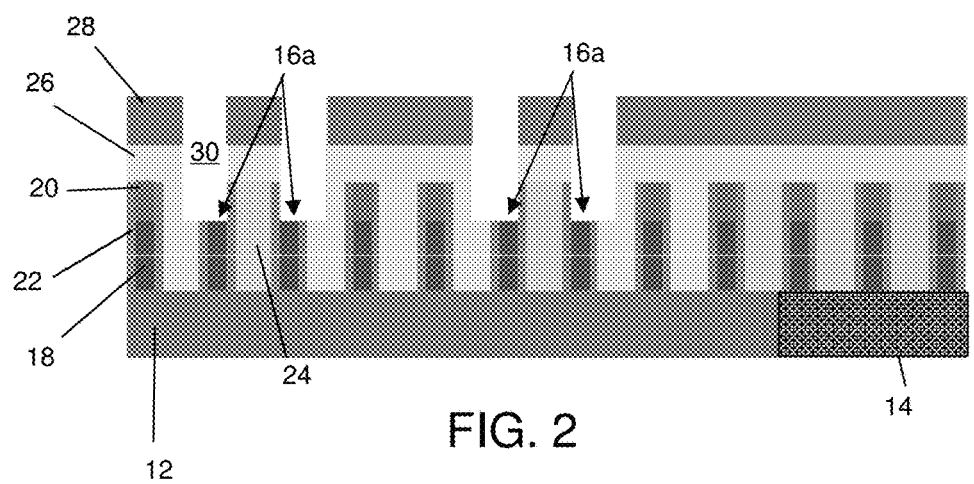
FIG. 2 shows a trench above selected gate and selected source/drain structures, amongst other features, and respective fabrication processes in accordance with aspects of the present disclosure.

In FIG. 2, a spin on material 26 is deposited on the gate structures 16 (and insulator material 24) and within empty spaces between the gate structures 16. The spin on material 26 can be, e.g., SiON; although other materials are also contemplated by the present disclosure. A hardmask and resist stack 28 is formed over the spin on material 26. An opening is formed in the stack 28 by using conventional lithography processes, e.g., exposing the resist to energy (light) to form a pattern (opening), followed by an etching process with a selective chemistry, e.g., reactive ion etching (RIE), to form one or more trenches 30 in the spin on material 26 aligned with selected gate structures 16a and the selected source/drain. The trenches 30 will land partially on the underlying material 18 of the gate structures 16a, e.g., removing portions of the sidewall spacers 22, hardmask 20, spin on material 26 and exposing the underlying metal(s) 18. In this way, a trench for a special contact can be printed using a single exposure, multiple exposures, EUV and DSA, etc.

Figure 3:
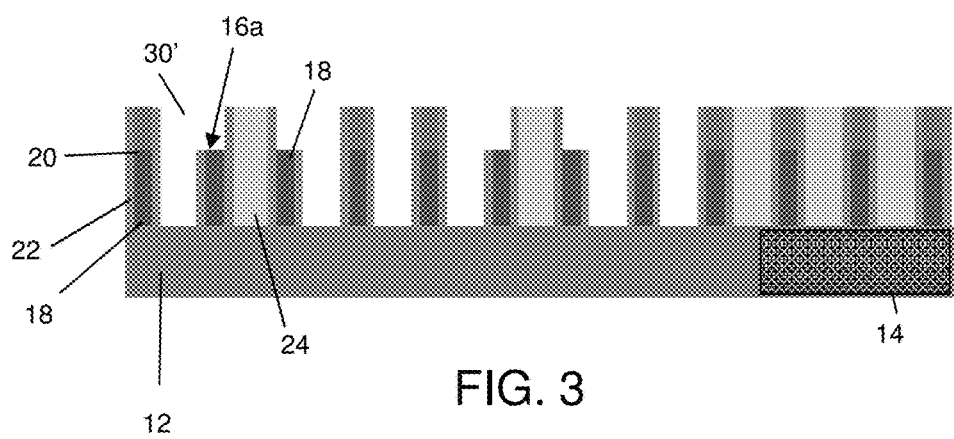
FIG. 3 shows a recess associated with selected gate and selected source/drain structures, amongst other features, and respective fabrication processes in accordance with aspects of the present disclosure.

In FIG. 3, the hardmask is removed by a conventional stripping process. The spin on material is also removed, exposing portions of the underlying fin structure 12 and workfunction metal(s) 18 of the selected gate structures 16a. In this way, dual damascene openings 30' are formed on adjacent gate structures 16a for subsequent contact formation.

Figure 4:
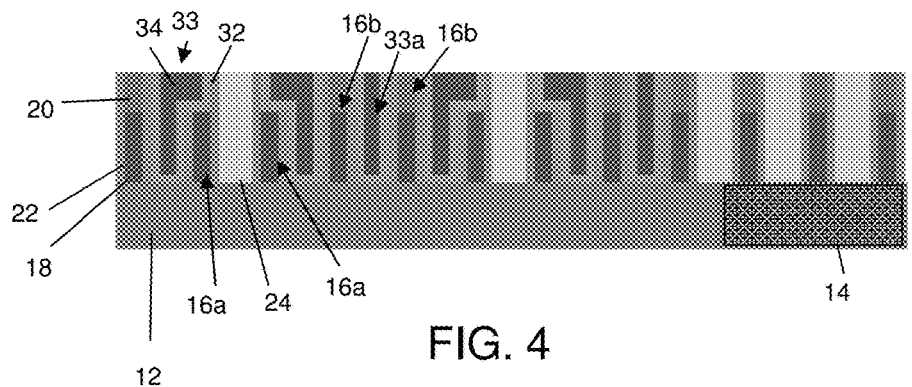
FIG. 4 shows contacts shorted to selected gate and selected source/drain structures, amongst other features, and respective fabrication processes in accordance with aspects of the present disclosure.

In FIG. 4, contacts 33 are formed in the dual damascene openings 30' and contacts 33a are formed between adjacent gate structures 16b, 16b. The contacts 33a are isolated from the metal(s) 18 of the adjacent gate structures 16b, 16b by the sidewall spacers 22 and will be used as source and drain contacts; whereas, the contacts 33 are shorted to the selected gate structures 16a, e.g., the metal(s) 18 of the gate structures 16a, and the selected source/drain. The contacts 33 can be used for an SRAM cell implementation.

In each of the different aspects described herein, the insulator material 24, e.g., $SiO_2$, will isolated the shorted selected gate structures 16a. Also, advantageously, the contacts 33 are provided below the M0 wiring level (e.g., first wiring layer). In this way, the contacts 33 will reduce congestion at the M0 wiring level, while still allowing source and drain contacts and gate contacts to connect to the M0 wiring level, as described herein.

Still referring to FIG. 4, the contacts 33, 33a can be composed of different conductive materials, deposited using conventional deposition processes, e.g., CVD. For example, the contacts 33, 33a can be composed of a liner material 32 and metal fill material 34. In embodiments, the liner material 32 can be TiN and/or Ti. The metal fill material 34 can be tungsten deposited by a conventional CVD process, followed by a chemical mechanical polishing (CMP) process.

Figure 5:
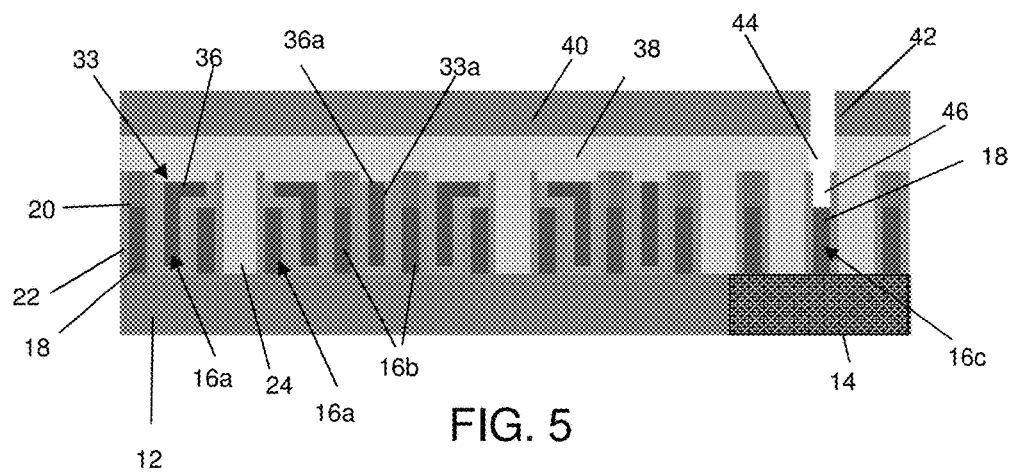
FIG. 5 shows a trench aligned with selected gate structures, amongst other features, and respective fabrication processes in accordance with aspects of the present disclosure.

As shown in FIG. 5, the contacts 33, 33a are recessed (as shown by reference numeral 36, 36a, respectively) by a selective timed etching process. An interlevel dielectric material 38 is formed over the gate structures 16a, 16b and contacts 33, 33a using a conventional CVD process, followed by a CMP process. A hardmask 40 is formed over the interlevel dielectric material 38, which is patterned to form an opening 42 aligned with a gate structure 16c. The opening 42 can be formed using conventional lithography processes, e.g., printed using a single exposure, multiple exposures, EUV and DSA, etc., which is used for subsequent gate contact formation. An etching process (e.g., RIE) is performed through the opening 42 to form a trench 44 in the dielectric material 38, exposing the workfunction metal(s) 18 of the gate structure 16c. More specifically, in embodiments, the etching process removes the hardmask 20 exposing the material(s) 18 of the gate structure 16c.

Figure 6:
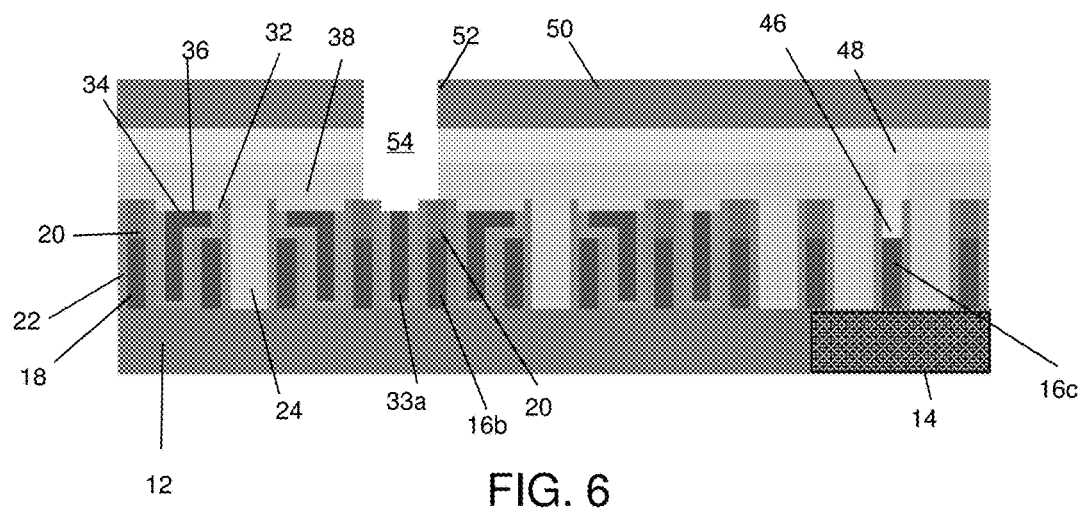
FIG. 6 shows a trench aligned with a source/drain contact, amongst other features, and respective fabrication processes in accordance with aspects of the present disclosure.

In FIG. 6, the hardmask 40 is removed and a spin on material 48 (e.g., SiON) is formed in the recess 46 of the gate structure 16c and over remaining exposed portions of the structure. A hardmask 50 is formed over the spin on material 48, which is patterned to form an opening 52 using conventional lithography and etching processes as described herein. An etching process (e.g., RIE) is then performed through the opening 52 to form a trench 54, which exposes the contact 33a. During this etching process, the hardmask 20 will protect the metal(s) 18 of the adjacent gate structures 16b, 16b. In this way, source/drain contact trenches can be printed using a single exposure, multiple exposures, EUV, and DSA, etc.

Figure 7:
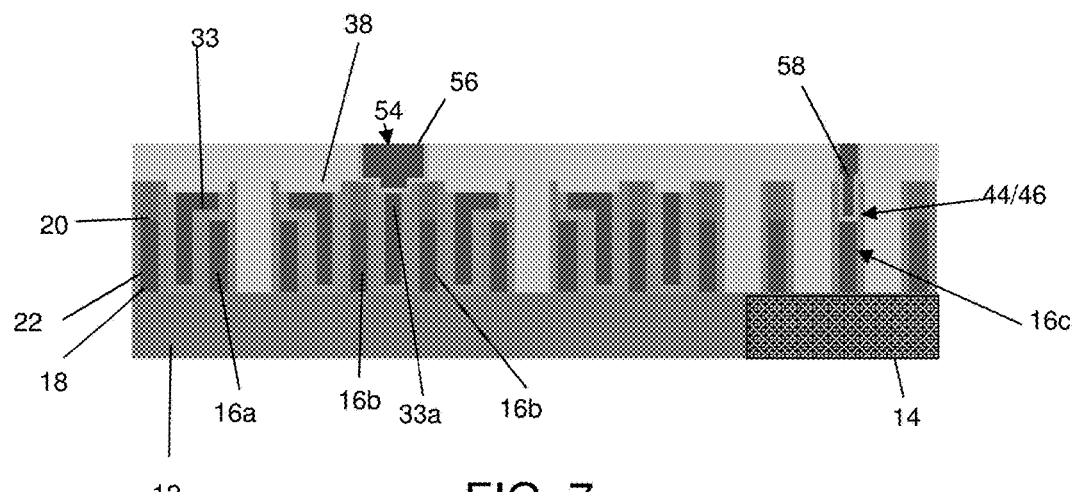
FIG. 7 shows contacts to the selected gate and selected source/drain structures, amongst other features, and respective fabrication processes in accordance with aspects of the present disclosure.

As shown in FIG. 7, the spin on material and hardmask are removed, exposing the contact 33a and the workfunction metal(s) 18 of the gate structures 16c. A metallization feature 56 is formed in the trench 54 and a metallization feature 58 is formed in the trench 44 and recessed portion 46 associated with the gate structure 16c. In embodiments, the metallization feature 56 is a contact to the source and drain regions of the gate structures 16b; whereas, the metallization feature 58 is a contact to the gate structure 16c, itself. In embodiments, the metallization features 56, 58 can be formed by deposition of liner material, e.g., Ti/TiN, and a metal fill material, e.g., tungsten, copper or cobalt. The liner and metal fill material can be deposited by conventional deposition methods, followed by a CMP process.

Figure 8:
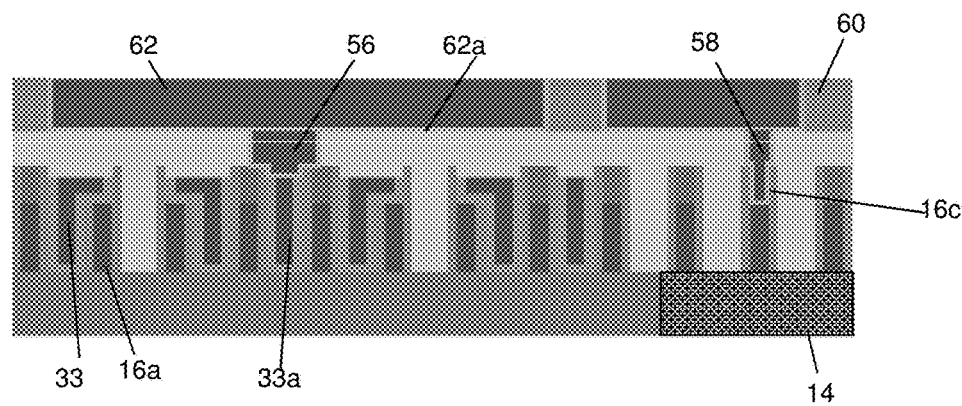
FIG. 8 shows a wiring layer contacting the selected gate and source/drain structures, and electrically isolated from the local connection contacts, amongst other features, and respective fabrication processes in accordance with aspects of the present disclosure.

In FIG. 8, a wiring layer 62 is formed in direct contact with the metallization features 56, 58. In embodiments, the wiring layer 62 is at the first wiring layer (e.g., M0 wiring level), and can be formed by deposition of insulator material 60, e.g., SiOC, followed by a patterning to form openings exposing the underlying metallization features 56, 58. The openings exposing the underlying metallization features 56, 58 can be formed by conventional lithography processes, e.g., optical LE″, self-aligned multiple patterning, EUV, and DSA, etc. A metal material is then deposited in the openings using conventional deposition methods, e.g., CVD processes. In embodiments, the wiring layer 62 can be formed by deposition of liner material 62a, e.g., Ti/TiN, in direct electrical contact with the metallization features 56, 58, and a metal fill material, e.g., tungsten, copper or cobalt. A CMP process can be performed to remove any excess metal fill material and liner material, and ready the structure (i.e., planarize) for subsequent metallization and back end of the line (BEOL) features.

Figure 9:
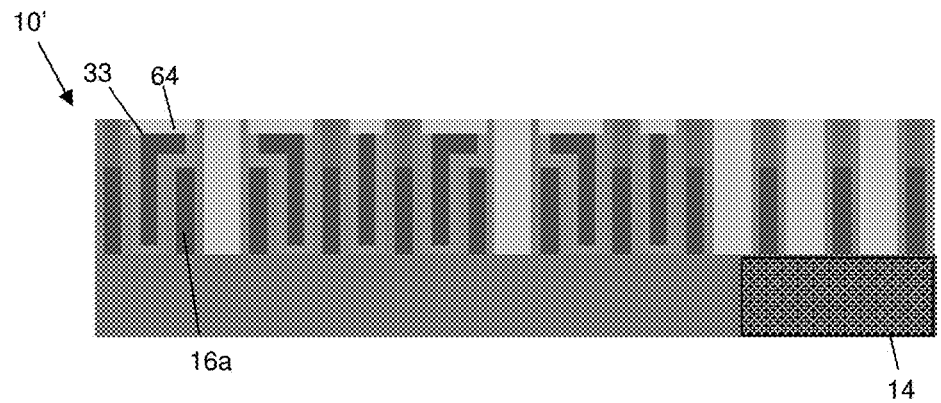
FIGS. 9 and 10 show alternative structures and respective fabrication processes in accordance with aspects of the present disclosure.
Figure 10:
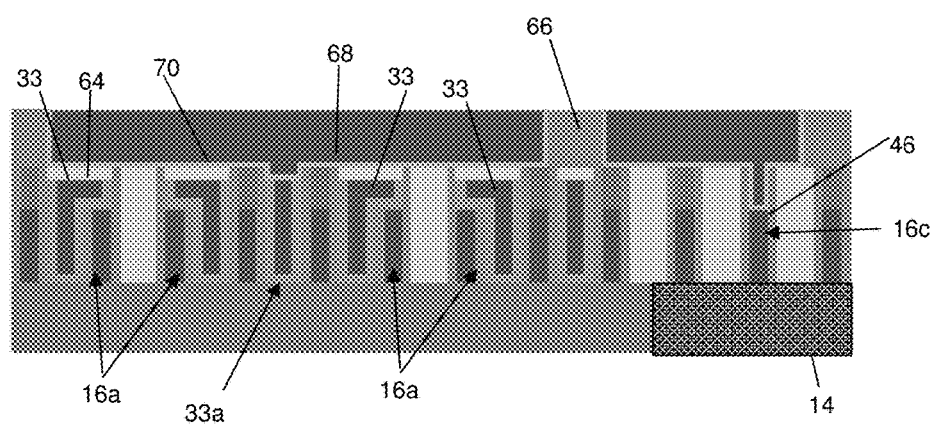

FIGS. 9 and 10 show structures and respective fabrication processes in accordance with additional aspects of the disclosure. In embodiments, FIGS. 9 and 10 can be representative of structures 10′ formed with self-aligned source/drain contacts and a non self-aligned gate contact, using a dual damascene process for the source/drain contacts and the gate contact. Alternatively, the structures can be formed with self-aligned source/drain and gate contacts, using a dual damascene process. In the self-aligned source/drain and gate contacts implementation, the gate structure 16c can be adjacent to contacts; whereas in the self-aligned source/drain contacts and non self-aligned gate contact implementation, the gate structure 16c is adjacent to insulating material, of which the gate structure 16c is also above an STI region, as an illustrative example. It should be understood, though, that other arrangements of the gate structures, contacts and insulator material are also contemplated herein. Also, in either scenario, the contacts 33 are provided for local routing below the M0 wiring level (e.g., first wiring layer). In this way, the contacts 33 will reduce congestion at the M0 wiring level, while still allowing source and drain contacts and gate contacts to connect to the M0 wiring level, as described herein.

As shown in FIG. 9, after recessing of the contacts 33, 33a, a dielectric material 64 will fill the recess above the contacts 33, followed by a CMP process. In embodiments, the dielectric material 64 can be an oxide material deposited by a conventional CVD process, as an example.

As shown in FIG. 10, following the CMP process, an insulator material 66, e.g., SiOC, is deposited and patterned to form openings to form the M0 wiring level. A spin on material and hardmask can then be deposited on the patterned insulator material 64, which is used to form a trench and recessed area 46 for the gate structure 16c (similar to that shown in FIG. 5). The patterning methods could be optical LE″, SADP, SAQP, EUV, and DSA, etc. The spin on material and hardmask is then be removed and another spin on material and hardmask is deposited and patterned to form a trench exposing contact 33a, similar to that described in FIG. 6. The spin on material and hardmask are then removed and metallization feature 68 (e.g., M0 wiring level) is formed in directed contact with the contact 33a and the gate structure 16c. As shown in FIG. 10, a single liner 70 is used in the metallization feature 68 to form self-aligned source and drain contacts (in contact with contact 33a) and a gate contact (in contact with gate structure 16c) using dual damascene processes. The single liner 70 is in direct electrical connection with the contact 33a, while the dielectric material 64 will isolate the contact 33 (which is shorted to the selected gate structure 16a and the selected source/drain) from the M0 wiring level, e.g., metallization feature 68.

Figure 11:
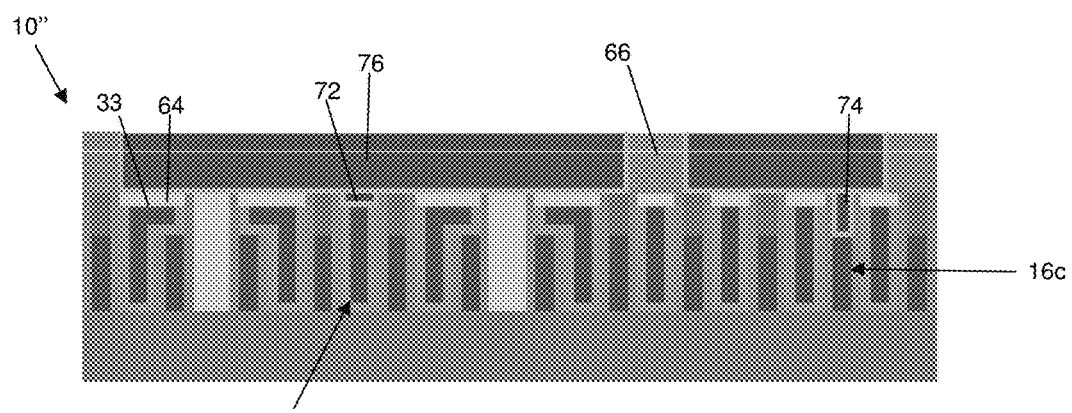
FIG. 11 shows an alternative structure and respective fabrication processes in accordance with aspects of the present disclosure.

In alternative embodiments, the structure 10″ shown in FIG. 11 can be formed by fabrication processes using self-aligned source/drain and the gate contacts, using a single damascene process for the source/drain and the gate contacts. Again, this implementation, the contacts 33, 33a are provided below the M0 wiring level (e.g., first wiring layer). Again, the contacts 33 are used for local routing and will reduce congestion at the M0 wiring level, while still allowing source and drain contacts and gate contacts to connect to the M0 wiring level, as described herein.

More specifically, as shown in FIG. 11, after recessing of the contacts 33, a dielectric material 64 will fill the recess above the contacts 33, followed by a CMP process (similar to FIG. 9). In embodiments, the dielectric material 64 can be an oxide material deposited by a conventional CVD process, as an example. Following the CMP, a hardmask is deposited and patterned over the structure. The patterning is aligned with the gate structure 16c (similar to that shown in FIG. 5). An etching process if performed to remove the hardmask of the gate structure 16c, exposing the metal(s) 18 (similar to FIG. 5). The hardmask is then removed, and a spin on material and hardmask are then formed and patterned over the contact 33a. By selective etching processes, a trench is formed in the spin on material followed by removal of the dielectric material 64 over the contact 33a, thereby exposing the metal material of the contact 33a. The spin on material and hardmask are then removed, followed by deposition of a liner 72 and metal fill material 74 (e.g., second segment of the contact) within the recesses formed by the removal processes. The liner 72 can be Ti/TiN and metallization fill material 74 can be, e.g., tungsten, copper or cobalt.

As further shown in FIG. 11, a wiring layer 76 is formed in direct contact with the metal fill material 74. In embodiments, the wiring layer 76 is at the first wiring layer (e.g., M0 level), and can be formed by deposition of insulator material 66, e.g., SiOC, followed by a patterning to form openings exposing the underlying metal fill material 74. The openings exposing the underlying metal fill material 74 can be formed by conventional lithography and etching processes.

A metal material is then deposited in the openings using conventional deposition methods, e.g., CVD processes. In embodiments, the wiring layer 76 can be formed by deposition of liner material, e.g., Ti/TiN, and a metal fill material, e.g., tungsten, copper or cobalt. A CMP process can be performed to remove any excess metal fill material and liner material, and to ready the structure (i.e., planarize) for subsequent metallization and back end of the line (BEOL) features. The wiring layer 76 is a first wiring layer, e.g., M0 wiring level, which connects to the source and drain contacts, and the gate contacts as already described herein.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   at least one contact electrically shorted to a gate structure and a source/drain region, and located below a first wiring layer; and
   source and drain contacts extending from selected gate structures and electrically connecting to the first wiring layer,
   wherein the at least one contact is isolated from the first wiring layer by a dielectric material formed in a recessed portion.

2. The structure of claim 1, further comprising a gate contact electrically connected between a gate structure and the first wiring layer.

3. The structure of claim 2, wherein the source and drain contacts and the gate contact are in direct electrical contact with a liner of the first wiring layer, which is formed in a recess.

4. The structure of claim 2, wherein the source and drain contacts comprise:
   a first segment between the selected gate structures which contact source and drain regions of the selected gate structures; and
   a second segment that includes a liner and metal fill,
   wherein a liner of the first wiring layer is in direct contact with the second segment.

5. The structure of claim 1, wherein the gate structure is a finFET structure.

6. The structure of claim 1, wherein the at least one contact is a local connection to the gate structure below the first wiring layer and the source and drain contacts extend from above a fin, adjacent to selected gate structures.

7. The structure of claim 1, wherein the at least one contact comprises a liner and metal fill.

8. The structure of claim 7, wherein the liner is TiN and the metal fill is tungsten.

9. The structure of claim 1, wherein the at least one contact is isolated from the first wiring layer by an interlevel dielectric material formed over at least one of the selected gate structures and at least one selected source/drain contact.

10. A structure, comprising:
    at least one contact electrically shorted to a respective gate structure and a source/drain region, and electrically isolated from a first wiring layer; and
    source and drain contacts extending and electrically connecting to the first wiring layer,
    wherein the at least one contact is isolated from the first wiring layer by a dielectric material formed in a recessed portion.

11. The structure of claim 10, further comprising a gate contact contacting a gate structure and extending to and electrically connected to the first wiring layer.

12. The structure of claim 10, wherein the at least one contact is a local connection below the first wiring layer.

13. The structure of claim 10, wherein the at least one contact comprises a liner and metal fill.

14. The structure of claim 10, wherein the at least one contact is isolated from the first wiring layer by an interlevel dielectric material formed over the at least one contact and the gate structure and selected gate structures.

15. The structure of claim 10, wherein the source and drain contacts are in direct electrical contact with a liner of the first wiring layer, which is formed in a recess.

16. A structure, comprising:
at least one contact electrically shorted to a respective gate structure and a source/drain region, and electrically isolated from a first wiring layer by a dielectric material formed in a recessed portion; and
source and drain contacts extending and electrically connecting to the first wiring layer,
wherein the source and drain contacts comprise:
a first segment between selected gate structures which contact source and drain regions of the selected gate structures; and
a second segment that includes a liner and metal fill,
wherein a liner of the first wiring layer is in direct contact with the second segment.

* * * * *